(12) United States Patent
Zhang et al.

(10) Patent No.: US 11,488,914 B2
(45) Date of Patent: Nov. 1, 2022

(54) TRANSFORMERS WITH BUILD-UP FILMS

(71) Applicant: TEXAS INSTRUMENTS INCORPORATED, Dallas, TX (US)

(72) Inventors: Zhemin Zhang, Allen, TX (US); Kenji Otake, Nagano (JP); Yi Yan, Sunnyvale, CA (US); Jeffrey Morroni, Parker, TX (US); Yuki Sato, Tokyo (JP); Takafumi Ando, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 12 days.

(21) Appl. No.: 16/581,033

(22) Filed: Sep. 24, 2019

(65) Prior Publication Data

US 2021/0091016 A1 Mar. 25, 2021

(51) Int. Cl.
| | |
|---|---|
| *H01L 23/64* | (2006.01) |
| *H01F 41/06* | (2016.01) |
| *H01F 41/02* | (2006.01) |
| *H01F 17/04* | (2006.01) |
| *H01F 27/28* | (2006.01) |
| *H01L 21/48* | (2006.01) |
| *H01L 23/31* | (2006.01) |

(Continued)

(52) U.S. Cl.
CPC .......... *H01L 23/645* (2013.01); *H01F 17/04* (2013.01); *H01F 27/022* (2013.01); *H01F 27/28* (2013.01); *H01F 41/0206* (2013.01); *H01F 41/06* (2013.01); *H01L 21/4842* (2013.01); *H01L 23/3114* (2013.01); *H01L 23/4952* (2013.01); *H01L 23/49503* (2013.01); *H01L 28/10* (2013.01)

(58) Field of Classification Search
CPC .............. H01L 23/645; H01L 23/3114; H01L 23/49503; H01L 23/4952; H01L 21/4842; H01L 28/10; H01F 17/04; H01F 27/022; H01F 27/28; H01F 41/0206; H01F 41/06
See application file for complete search history.

(56) References Cited

U.S. PATENT DOCUMENTS 5,781,093 A * 7/1998 Grandmont ......... H01F 17/0006
336/183
5,949,321 A 9/1999 Grandmont et al.
(Continued)

FOREIGN PATENT DOCUMENTS

| JP | H056829 | 1/1993 |
|---|---|---|
| JP | 2010129875 | 6/2010 |
| WO | 2016202949 | 12/2016 |

*Primary Examiner* — Lex H Malsawma
(74) *Attorney, Agent, or Firm* — Ronald O. Neerings; Charles A. Brill; Frank D. Cimino

(57) ABSTRACT

In examples, a method of manufacturing a transformer device comprises providing a first magnetic member and providing a laminate member containing primary and secondary transformer windings wound around an orifice extending through the laminate member. The method further comprises positioning a build up film abutting the laminate member. The method also comprises positioning at least a portion of a second magnetic member in the orifice. The method further comprises heat pressing at least one of the first and second magnetic members such that a distance between the first and second magnetic members decreases and such that the build-up film melts, thereby producing a transformer device.

32 Claims, 11 Drawing Sheets

(51) Int. Cl.
*H01L 23/495* (2006.01)
*H01L 49/02* (2006.01)
*H01F 27/02* (2006.01)

(56) References Cited

U.S. PATENT DOCUMENTS

| | | | |
|---|---|---|---|
| 8,237,535 B2 * | 8/2012 | Hollevoet | H01F 27/306 336/200 |
| 2011/0241816 A1 * | 10/2011 | Park | H01F 27/2804 336/200 |
| 2012/0086102 A1 * | 4/2012 | Hofmann | H01L 28/10 257/531 |
| 2020/0211754 A1 * | 7/2020 | Zhang | H01F 19/08 |

* cited by examiner

TRANSFORMERS WITH BUILD-UP FILMS

BACKGROUND

Semiconductor dies are typically housed inside packages that protect the dies from deleterious environmental influences, such as heat, moisture, and debris. A packaged die communicates with electronic devices outside the package via conductive terminals, such as leads, that are exposed to outer surfaces of the package. A package may include components other than circuits formed on semiconductor dies. For example, a transformer assembly may be housed in a package, with the terminals of the transformer coil coupled to appropriate electrical connections (e.g., bond wires, lead frame leads) within the package so that the transformer assembly may be used as needed (e.g., by a circuit formed on a semiconductor die housed in the package).

SUMMARY

In examples, a method of manufacturing a transformer device comprises providing a first magnetic member and providing a laminate member containing primary and secondary transformer windings wound around an orifice extending through the laminate member. The method further comprises positioning a build up film abutting the laminate member. The method also comprises positioning at least a portion of a second magnetic member in the orifice. The method further comprises heat pressing at least one of the first and second magnetic members such that a distance between the first and second magnetic members decreases and such that the build-up film melts, thereby producing a transformer device.

In examples, a semiconductor device comprises a first magnetic member, a second magnetic member, and a laminate member positioned between the first and second magnetic members. The laminate member contains primary and secondary transformer windings. The package also comprises a build-up film material positioned between the first and second magnetic members and abutting the laminate member.

BRIEF DESCRIPTION OF THE DRAWINGS

For a detailed description of various examples, reference will now be made to the accompanying drawings in which.

DETAILED DESCRIPTION

Some transformer assemblies are formed using coils positioned between multiple magnetic members. Spaces within a transformer assembly, for example between the magnetic members and the coils, are filled using an appropriate die attach material. The die attach material provides mechanical support and moisture resistance, and it serves a variety of functional purposes (e.g., conducting current, heat dissipation). Current techniques for applying the die attach material, however, are unsatisfactory because they leave residual air gaps (e.g., air bubbles) in spaces where die attach material should have been deposited. This results in numerous problems, including breakdown at low voltages, which significantly affects the transformer's isolation performance. The residual air gaps also may have a negative impact on the mechanical stability and reliability of the transformer assembly. In addition, multiple curing steps may be needed to manufacture the transformer assembly, which can be time-consuming and complicated, and can substantially increase manufacturing costs.

This disclosure describes various examples of a novel transformer device and methods for manufacturing the novel transformer device. Instead of using die attach material to fill spaces within the transformer device, the transformer device is formed using a build-up film (e.g., a polymer prepreg film, such as AJINOMOTO® ABF® build-up film). The build-up film serves similar purposes as the die attach material described above, but it is superior to die attach material because it leaves few—if any—gaps when melted, due to its physical properties which are described below. The build-up film is positioned between a pair of magnetic members and adjacent to a laminate member that comprises coils. The laminate member and the build up films are positioned between the magnetic members, and the magnetic members are subsequently heat-pressed to melt the build up films and to cause them to flow, filling in the gaps between the magnetic members and the laminate member. This technique minimizes or eliminates the size and number of air gaps in the transformer assembly relative to existing transformer assembly manufacturing techniques, thereby producing a transformer assembly with superior performance and mechanical stability. In addition, tedious and expensive curing steps are eliminated from the manufacturing process.

Figure 1:
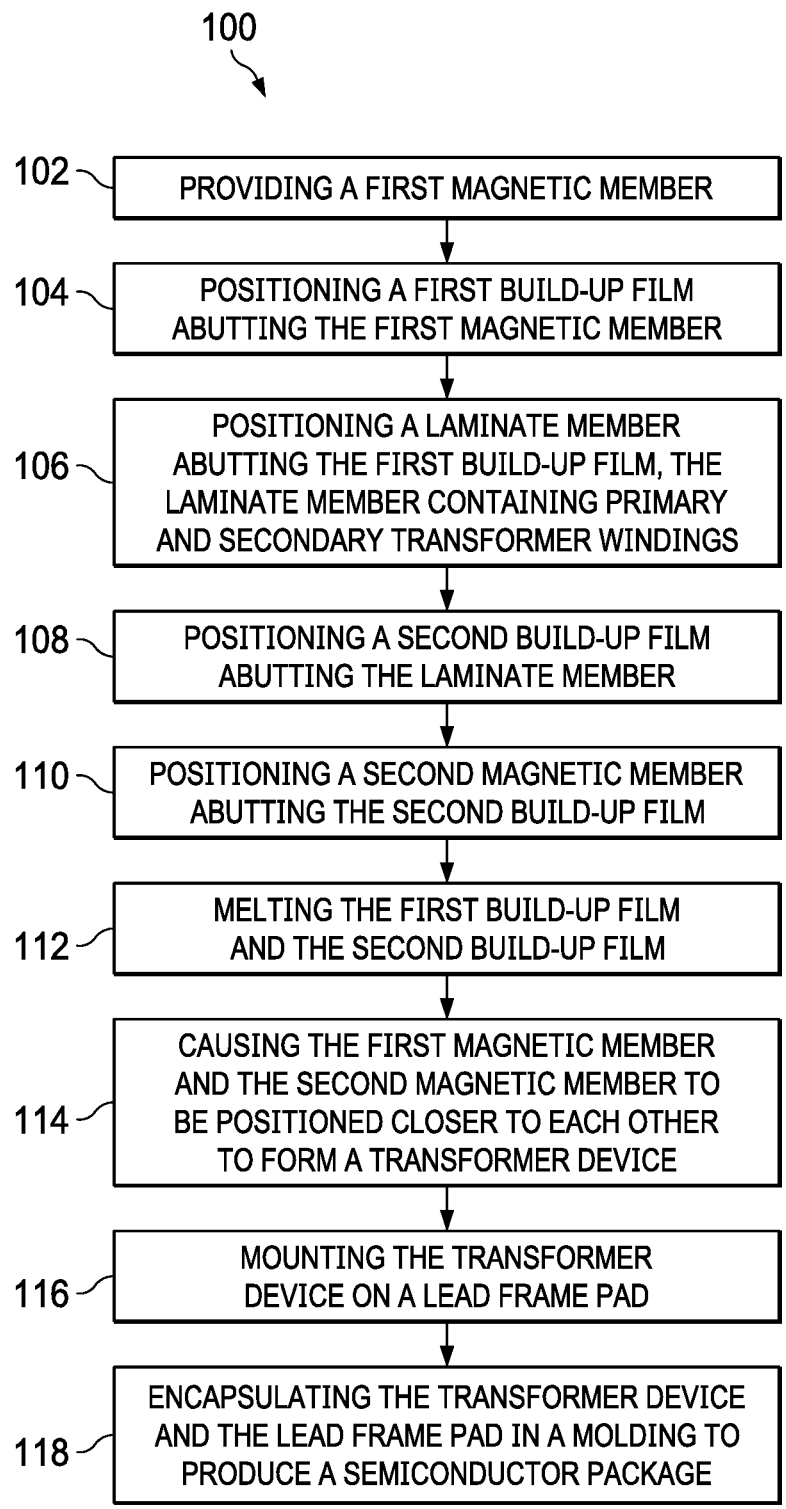
FIG. 1 depicts a flow diagram of a method of manufacturing a semiconductor package housing a transformer comprising a build-up film, in accordance with various examples.

FIG. 1 depicts a flow diagram of a method 100 of manufacturing a semiconductor package housing a transformer comprising a build-up film, in accordance with various examples. The method 100 is described below in tandem with FIGS. 2A-3G. Accordingly, FIGS. 2A-3G are now briefly introduced, followed by a detailed description of FIGS. 1-3G in tandem.

Figure 2A:
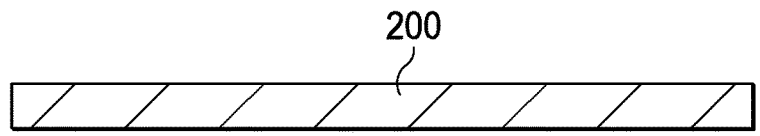
FIGS. 2A-2F depict frontal, cross-sectional views of the manufacture of a semiconductor package housing a transformer comprising a build-up film, in accordance with various examples.
Figure 2B:
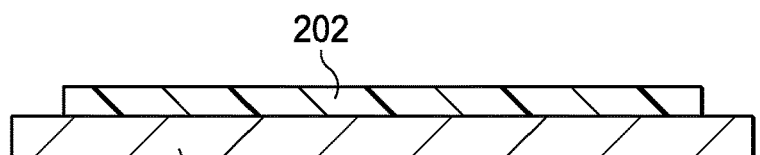
Figure 2C:
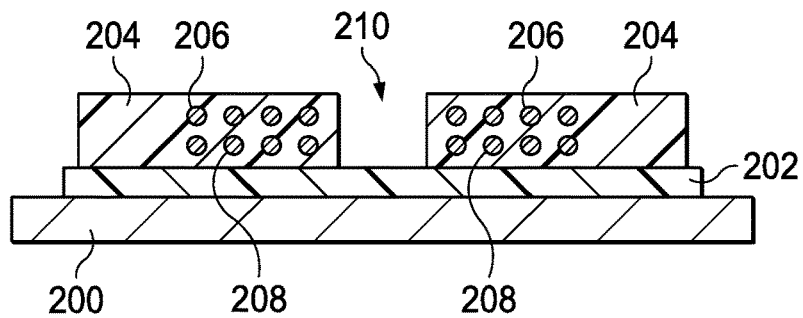
Figure 2D:
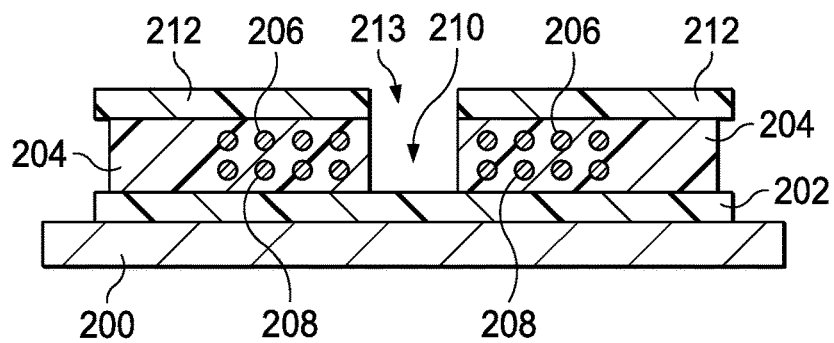
Figure 2E:
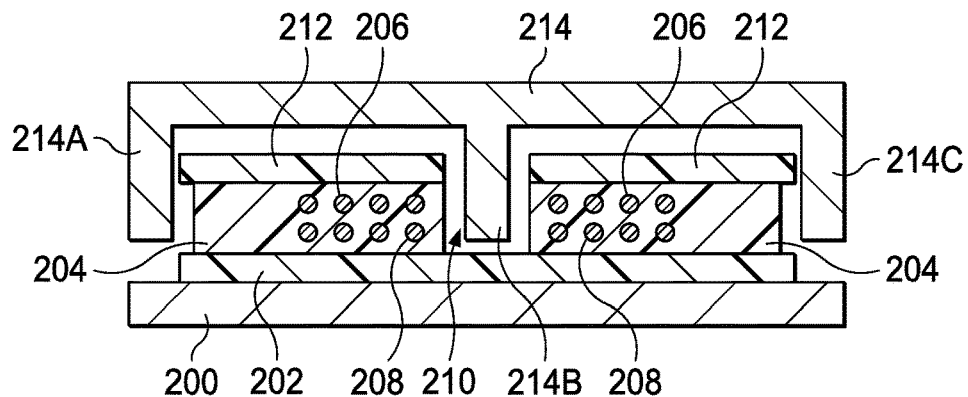
Figure 2F:
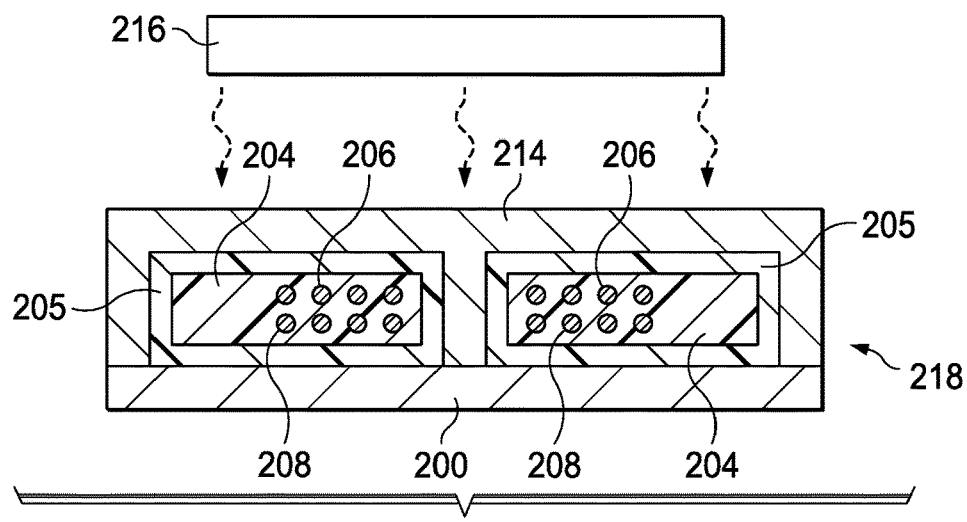
Figure 2G:
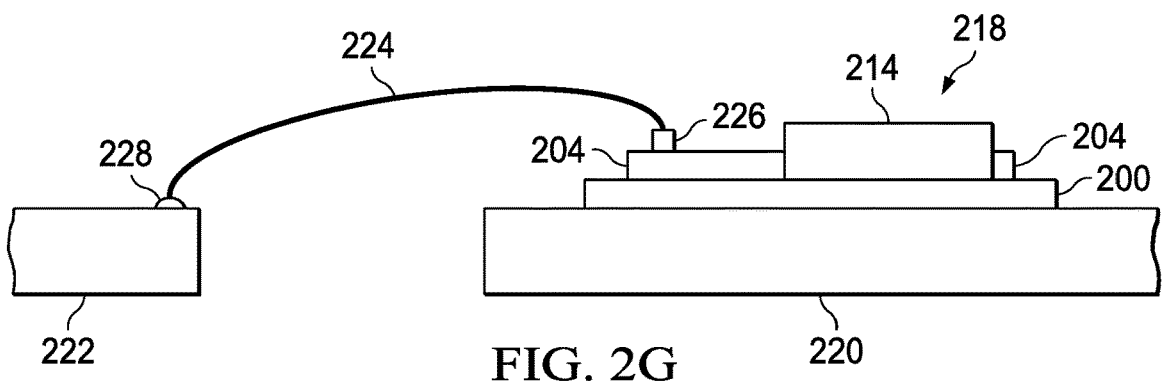
FIGS. 2G and 2H depict side and perspective views, respectively, of the manufacture of a semiconductor package housing a transformer comprising a build-up film, in accordance with various examples.
Figure 2H:
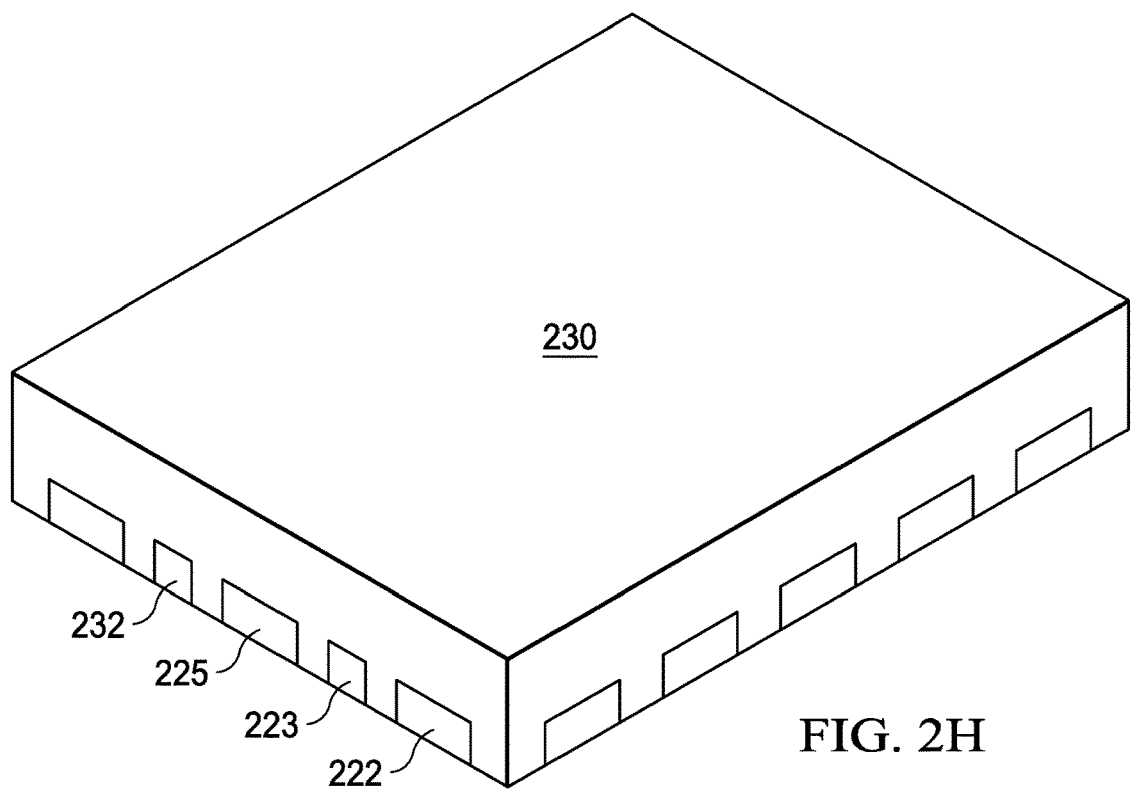

FIGS. 2A-2F depict frontal, cross-sectional views of the manufacture of a semiconductor package housing a transformer comprising a build-up film, in accordance with various examples. FIGS. 2G and 2H depict side and perspective views, respectively, of the manufacture of a semiconductor package housing a transformer comprising a build-up film, in accordance with various examples. FIGS. 3A-3G depict top-down views of the manufacture of a semiconductor package housing a transformer comprising a build-up film, in accordance with various examples.

Referring to FIGS. 1-3G in tandem, the method 100 begins by providing a first magnetic member (step 102). In some examples, the first magnetic member comprises a high-permeability ferrite member (e.g., with a permeability range up to 150 ferrite magnetic sheets). In some examples, the first magnetic member comprises a rectangular prism with illustrative dimensions of 5 mm width by 5 mm length by 270 um thickness. Other permeability ranges, shapes, and sizes of magnetic members are contemplated and included in the scope of this disclosure. FIG. 2A depicts a frontal, cross-sectional view of an illustrative magnetic member 200, and FIG. 3A depicts a top-down view of the illustrative magnetic member 200.

Figure 3A:
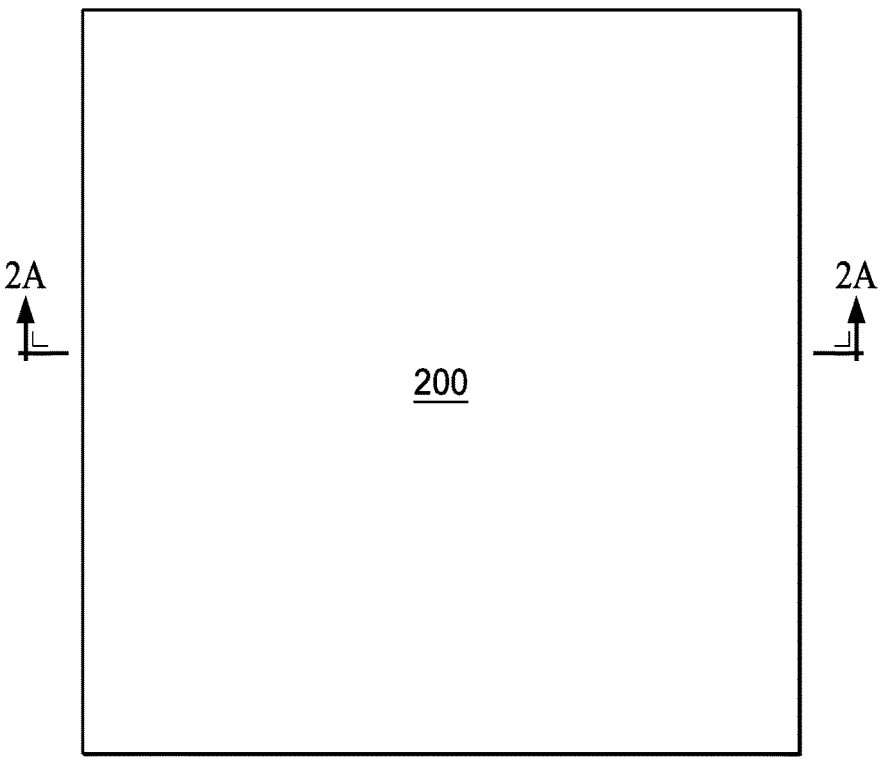
FIGS. 3A-3G depict top-down views of the manufacture of a semiconductor package housing a transformer comprising a build-up film, in accordance with various examples.
Figure 3B:
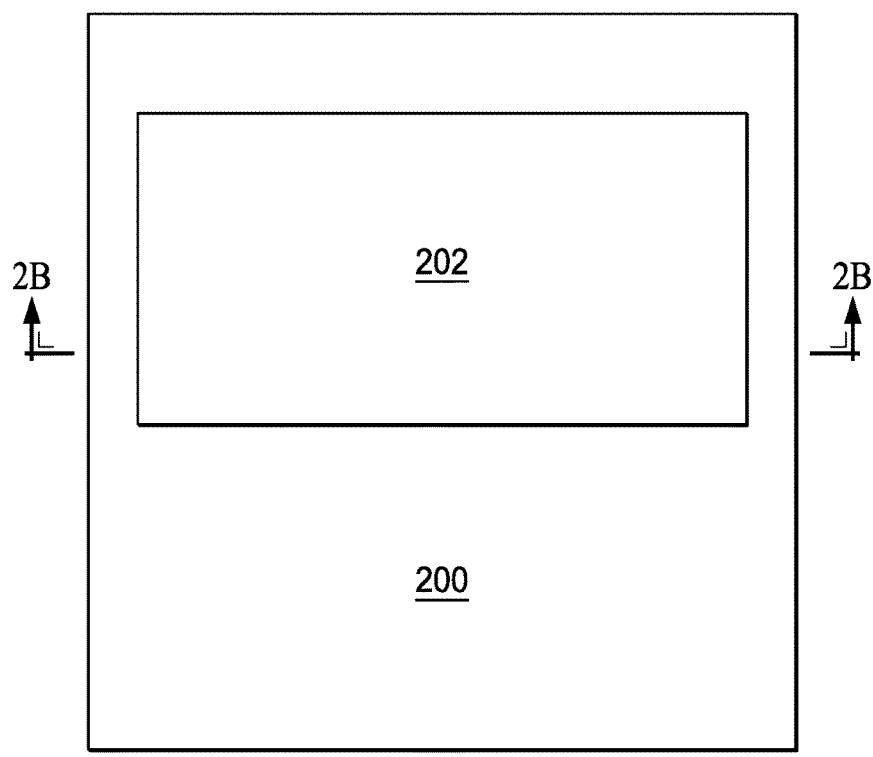

The method 100 continues by positioning a first build-up film abutting the first magnetic member (step 104). In some examples, the first build-up film comprises a polymer material, such as AJINOMOTO® ABF® build-up film. In some examples, the first build-up film has specific properties, such as a generally low coefficient of thermal expansion in the range of 46 ppm over the temperature range of 25-150 degrees Celsius; a glass transition temperature of approximately 170 degrees Celsius; a generally low dielectric constant around 3; and a suitably high level of insulation reliability. Other types of build-up films also may be used, so long as their behavior (e.g., viscosity) with respect to temperature and pressure is similar to that of the first build-up film described herein. In some examples, the first build-up film, when positioned according to step 102, is solid or semi-solid and has the shape of a rectangular prism. In some examples, the dimensions of the first build-up film are 5 mm in length by 6 mm in width by 25 um in thickness. Other shapes and sizes are contemplated and included in the scope of this disclosure. FIG. 2A depicts a frontal, cross-sectional view of an illustrative build-up film 202 positioned atop and abutting the first magnetic member 200. FIG. 3B depicts a top-down view of the illustrative build-up film 202 positioned atop and abutting the first magnetic member 200. As shown, in some examples, the build-up film 202 is smaller in volume than the first magnetic member 200. In some examples, multiple build-up films 202 may be used, as described in detail below.

Figure 3C:
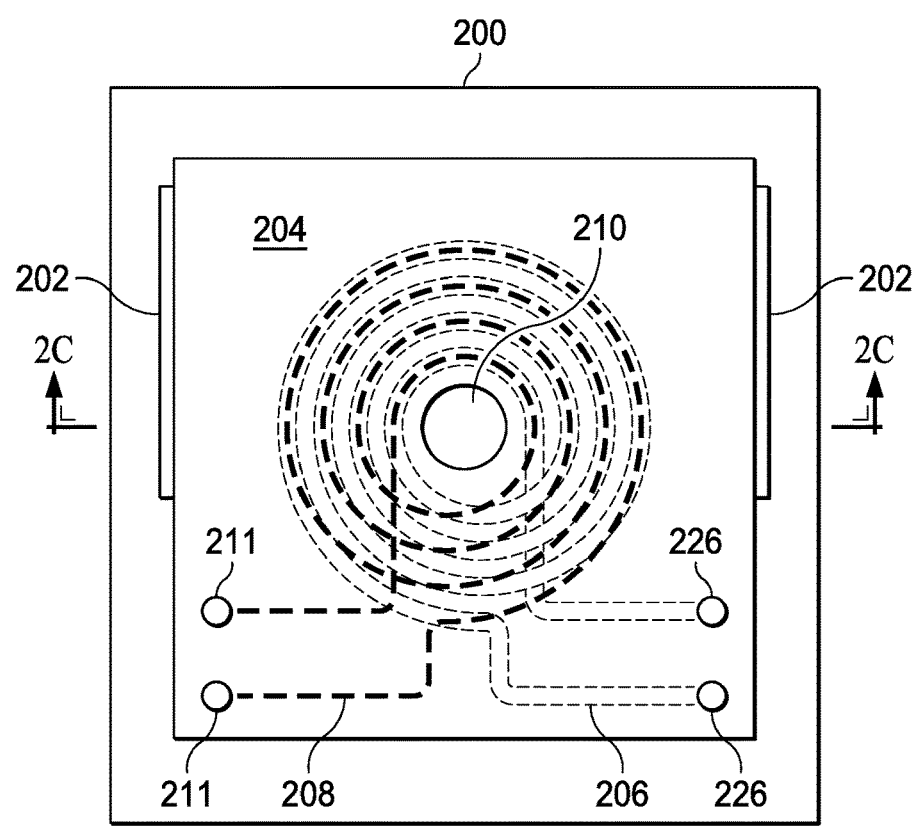

The method 100 further includes positioning a laminate member abutting the first build-up film, the laminate member containing primary and secondary transformer windings (step 106). In some examples, the laminate member comprises prepreg and/or BT CORELAYER®, both of which are polymer matrix materials. In some examples, the laminate member has illustrative dimensions of 5 mm in length, 6 mm in width, and 388 um in thickness. In some examples, the laminate member is a rectangular prism. The scope of this disclosure is not limited to the use of laminate members of any particular size, shape, or configuration. In examples, the laminate member includes an orifice (e.g., a cylindrical orifice) that extends through some or all of the thickness of the laminate. In examples, the primary transformer winding is wound around the orifice and is contained within the laminate member. In examples, the secondary transformer winding is wound around the orifice and is contained within the laminate member. FIG. 2C depicts a frontal, cross-sectional view of an illustrative laminate member 204 with an orifice 210 extending through the thickness of the laminate member 204. As FIG. 2C also shows, the laminate member 204 comprises a primary transformer winding 206 wound around the orifice 210 and a secondary transformer winding 208 wound around the orifice 210. FIG. 3C depicts a top-down view of the laminate member 204 positioned atop and abutting the build-up film 202. In some examples, the laminate member 204 is larger in volume than the build-up film 202 but is smaller in volume than the first magnetic member 200. In addition, as FIG. 3C depicts, the primary transformer winding 206 includes terminals 226 on opposing ends of the primary transformer winding 206, which are exposed to a top surface of the laminate member 204. Similarly, the secondary transformer winding 208 includes terminals 211 on opposing ends of the secondary transformer winding 208, which are also exposed to the top surface of the laminate member 204.

Figure 3D:
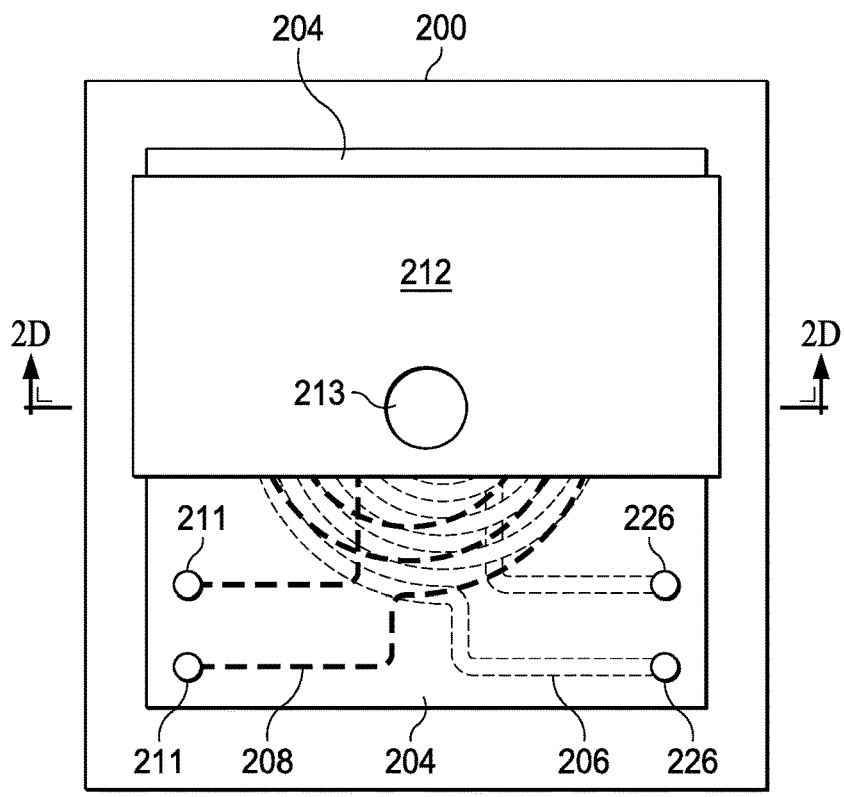

The method 100 continues by positioning a second build-up film abutting the laminate member (step 108). In some examples, multiple second build-up films may be used, as described in detail below. In some examples, the second build-up film comprises a polymer material, such as AJINOMOTO® ABF® build-up film. In some examples, the second build-up film has specific properties, such as those described above with respect to the first build-up film. Other types of build-up films also may be used, so long as their behavior (e.g., viscosity) with respect to temperature and pressure is similar to that of the second build-up film described herein. In some examples, the second build-up film, when positioned according to step 102, is solid or semi-solid and has the shape of a rectangular prism. In some examples, the dimensions of the second build-up film are 5 mm in length by 6 mm in width by 25 um in thickness. Other shapes and sizes are contemplated and included in the scope of this disclosure. In examples, the second build-up film includes an orifice that aligns with the orifice 210 (FIG. 2C). FIG. 2D depicts a frontal, cross-sectional view of an illustrative build-up film 212 positioned atop and abutting the laminate member 204. FIG. 3D depicts a top-down view of the illustrative build-up film 212 positioned atop and abutting the laminate member 204. As shown, in some examples, the build-up film 212 is smaller in volume than the laminate member 204. Although FIGS. 2D and 3D depict one build-up film 212, in some examples, additional build-up films 212 may be used. Regardless of the number of build-up films 212 used, the configuration of the build-up film(s) 212 should not block the orifice 210 so that a second magnetic member may be positioned inside the orifice, as is now described. For example, the build-up film 212 comprises a cylindrical orifice 213 that may be aligned with the orifice 210.

Figure 3E:
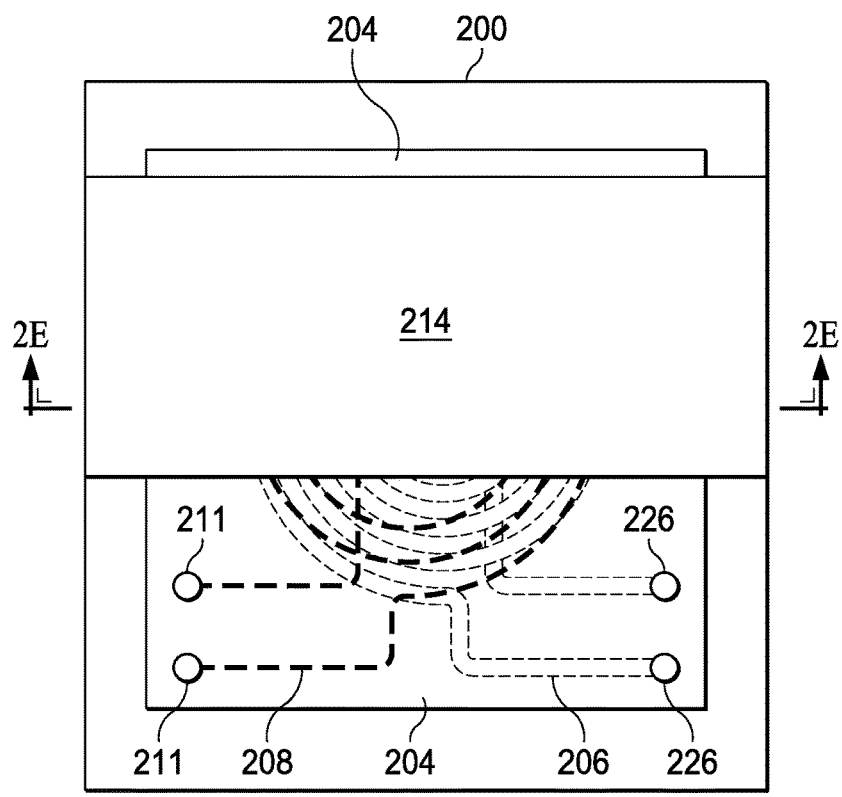

The method 100 continues with positioning a second magnetic member abutting the second build-up film (step 110). In examples, the second magnetic member is similar in composition to the first magnetic member. In examples, the length and width dimensions of the second magnetic member are similar (i.e., within 10%) to those of the first magnetic member. In examples, the thickness of the second magnetic member varies because the second magnetic member comprises multiple vertical extensions. FIG. 2E depicts a frontal, cross-sectional view of a second magnetic member 214 adjacent to the second build-up film 212. The second magnetic member 214 has extensions 214A, 214B, and 214C, as shown. In examples, the thickness of the second magnetic member 214 in portions that include extensions 214A, 214B, or 214C is approximately 658 um. In examples, the thickness of the second magnetic member 214 in portions that do not include extensions 214A, 214B, or 214C is approximately 270 um. In examples, the extension 214B is positioned inside the orifice 210, with the extensions 214A and 214C positioned laterally to the laminate member 204. FIG. 3E depicts a top-down view of the second magnetic member 214 positioned as described above.

Figure 3F:
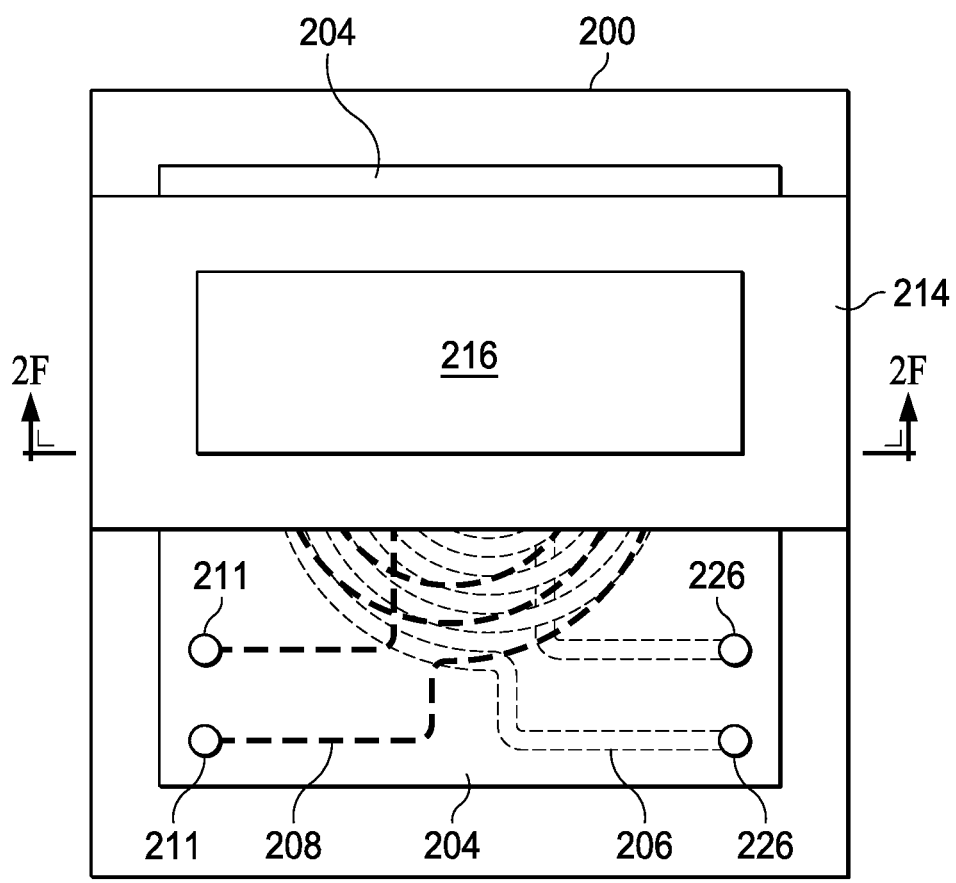

The method 100 further comprises melting the first and second build-up films (step 112) and causing the first and second magnetic members to be positioned closer to each other to form a transformer device (step 114). In some examples, the build-up films may be melted by applying heat and pressure to the second magnetic member 214. In some examples, the build-up films may be melted by applying heat and pressure to the first magnetic member 200. In some examples, the build-up films may be melted by applying heat to the second magnetic member 214 and pressure to the first magnetic member 200. In some examples, the build-up films may be melted by applying heat to the first magnetic member 200 and pressure to the second magnetic member 214. Other configurations of heat and pressure application are contemplated and included in the scope of this disclosure. FIG. 2F depicts the application of a heat press 216 to the second magnetic member 214. FIG. 3F likewise depicts the application of the heat press 216. In some examples, the temperature (e.g., 200 degrees Celsius) and pressure (e.g., 5-10 MPa) of the heat press 216 depends on the material composition of the build-up films 202, 212 and their melting points. In examples, the build-up films 202, 212 melt to form a melted build-up film 205 that fills all spaces (including the orifice 210) between the laminate member 204 and the first and second magnetic members 200, 214, as shown. In such examples, there are no air gaps remaining in the areas between the laminate member 204 and the first and second magnetic members 200, 214, thereby mitigating the challenges associated with the current state of the art, as described above. The pressure applied causes the first and second magnetic members 200, 214 to move toward each other, as FIG. 2F shows, such that the first and second magnetic members 200, 214 are in contact, thereby producing a transformer device 218. FIG. 3F shows an illustrative top-down view.

Figure 3G:
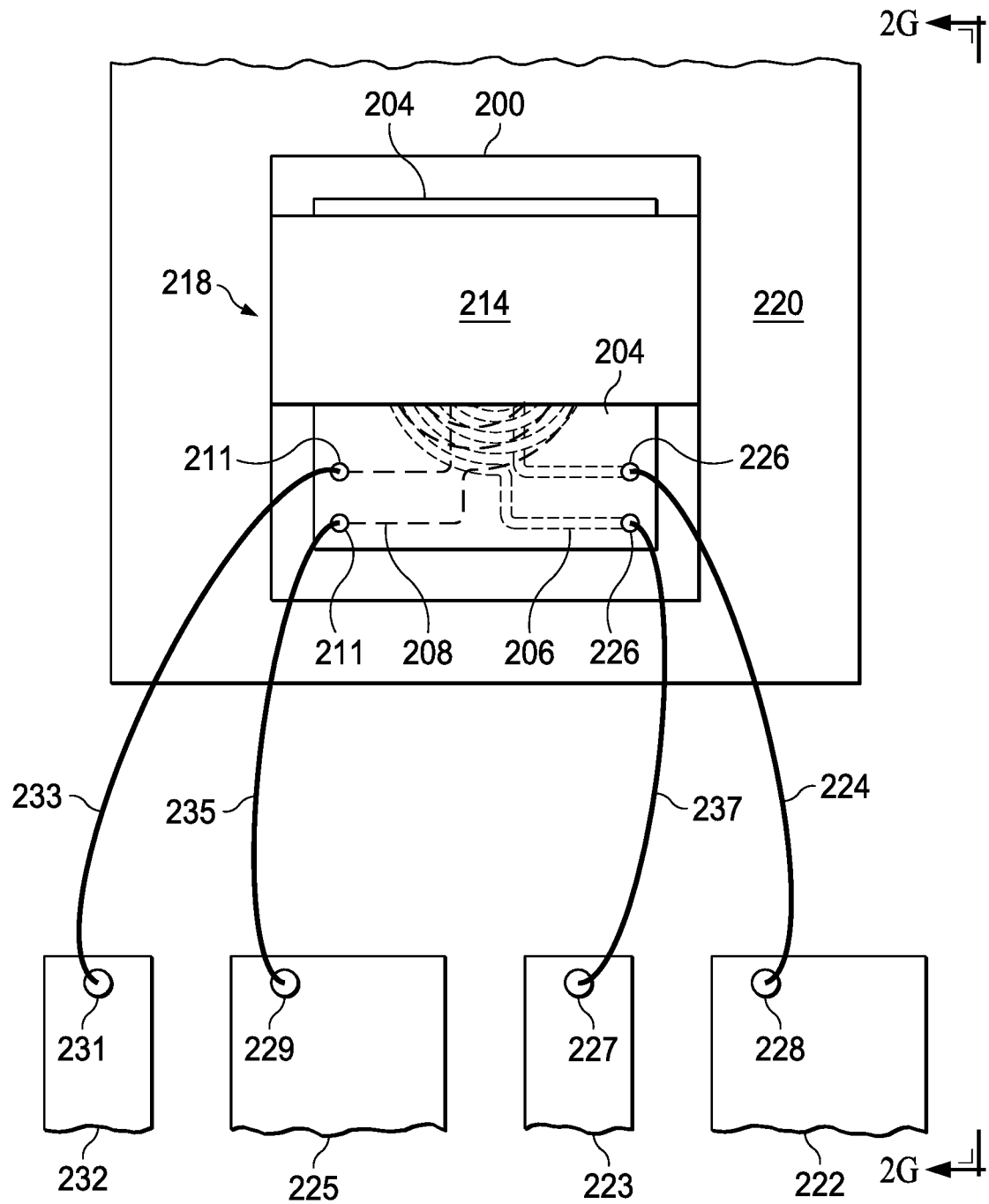

The method 100 also comprises mounting the transformer device on a lead frame pad (step 116), such as a die pad. FIG. 2G depicts a side view of the transformer device 218 positioned on a lead frame pad 220. A bond wire 224 couples the terminal 226 to a ball 228 on a conductive terminal 222 of a lead frame (e.g., a package lead). The other terminals of the transformer device 218 may couple to other conductive terminals as may be appropriate. FIG. 3G depicts a top-down view of the assembly of FIG. 2G, with one of the terminals 226 coupled to the ball 228 on the conductive terminal 222, another one of the terminals 226 coupled to the ball 227 on a conductive terminal 223 via a bond wire 237, one of the terminals 211 to a ball 229 on a conductive terminal 225 via a bond wire 235, and another one of the terminals 211 coupled to a ball 231 on a conductive terminal 232 via a bond wire 233.

The method 100 still further comprises encapsulating the transformer device and the lead frame pad in a molding to produce a semiconductor package (step 118). FIG. 2H depicts a perspective view of a semiconductor package 230 having conductive terminals 222, 223, 225, and 232 exposed to one or more surfaces of the semiconductor package 230.

Figure 4A:
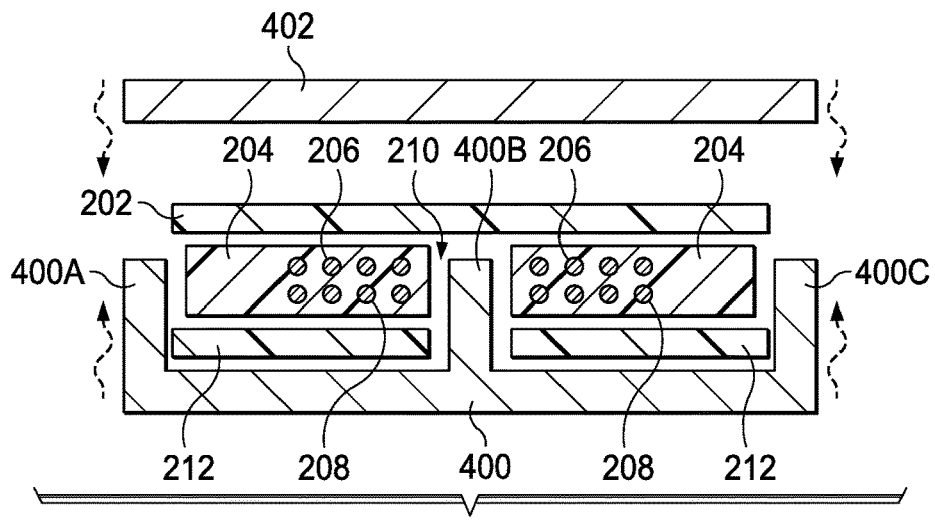
FIGS. 4A and 4B depict frontal, cross-sectional views of the manufacture of a semiconductor package housing a transformer comprising a build-up film and alternative magnetic members, in accordance with various examples.
Figure 4B:
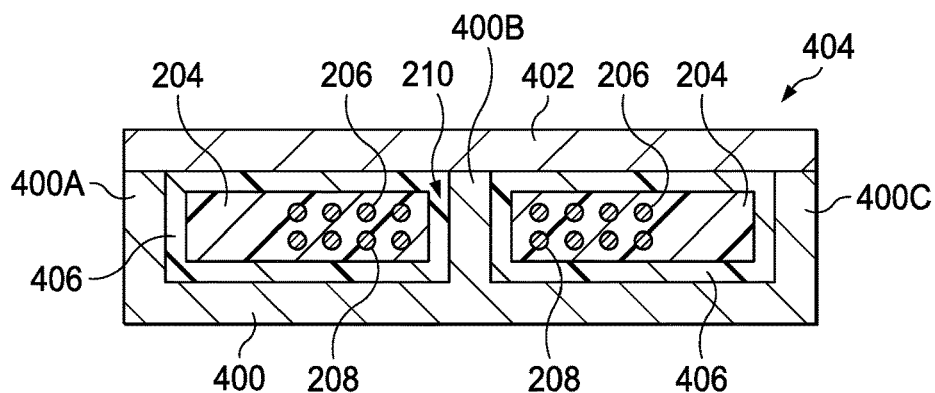

The first and second magnetic members 200, 214 are referred to as I and E core members, respectively, because in the frontal view of FIGS. 2E and 2F, the first and second magnetic members 200, 214 resemble the English capital letters "I" and "E" rotated 90 degrees, respectively. In some examples, magnetic members of other shapes may be used. For example, FIG. 4A depicts an assembly in which a first magnetic member 400 is an E core member and a second magnetic member 402 is an I core member. The application of heat and pressure, as the arrows in FIG. 4A depict, results in the formation of a transformer device 404 (FIG. 4B) in which the first and second magnetic members 400, 402 are in contact with each other and in which the build-up films 202, 212 are melted into a build-up film 406 (which may be said to include the build-up films 202, 212). In examples, the build-up film 406 fills all areas between the laminate member 204 and the first and second magnetic members 400, 402, including the orifice 210, leaving no air gaps. The first magnetic member 400 comprises extensions 400A, 400B, and 400C, with the extension 400B positioned in the orifice 210, as shown, and with the extensions 400A, 400C positioned laterally to the laminate member 204.

Figure 5A:
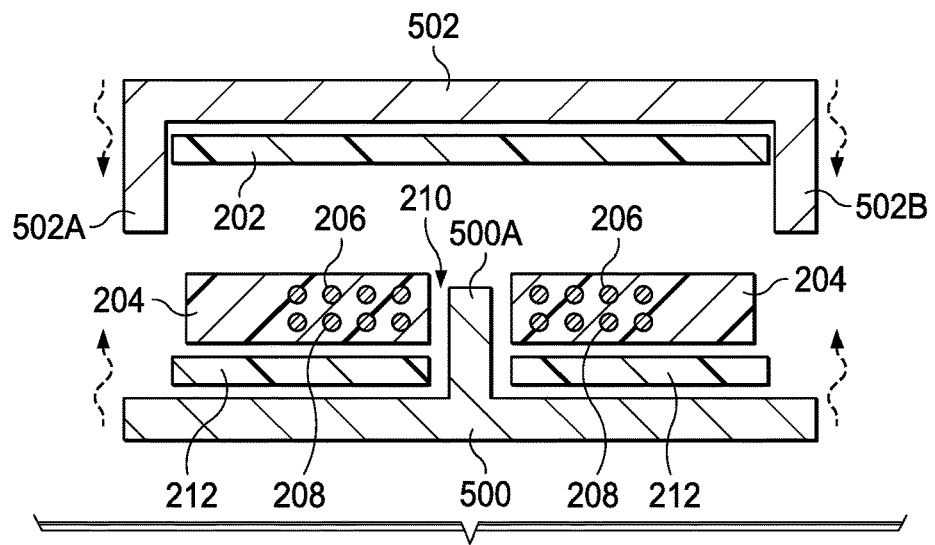
FIGS. 5A and 5B depict frontal, cross-sectional views of the manufacture of a semiconductor package housing a transformer comprising a build-up film and alternative magnetic members, in accordance with various examples.
Figure 5B:
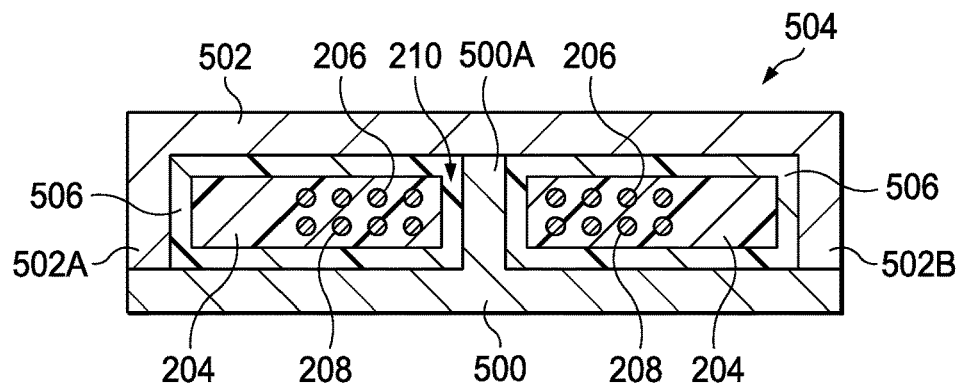

In another example, FIG. 5A depicts an assembly in which a first magnetic member 500 is a T core member (because the first magnetic member 500 resembles an upside-down English capital letter "T") and a second magnetic member 502 is a U core member (because the second magnetic member 502 resembles an upside-down English capital letter "U"). The application of heat and pressure, as the arrows in FIG. 5A depict, results in the formation of a transformer device 504 (FIG. 5B) in which the first and second magnetic members 500, 502 are in contact with each other and in which the build-up films 202, 212 are melted into a build-up film 506 (which may be said to include build-up films 202, 212). In examples, the build-up film 506 fills all areas between the laminate member 204 and the first and second magnetic members 500, 502, including the orifice 210. The first magnetic member 500 comprises an extension 500A, which is positioned in the orifice 210, as shown. The second magnetic member 502 comprises extensions 502A, 502B, which are positioned laterally to the laminate member 204.

Figure 6A:
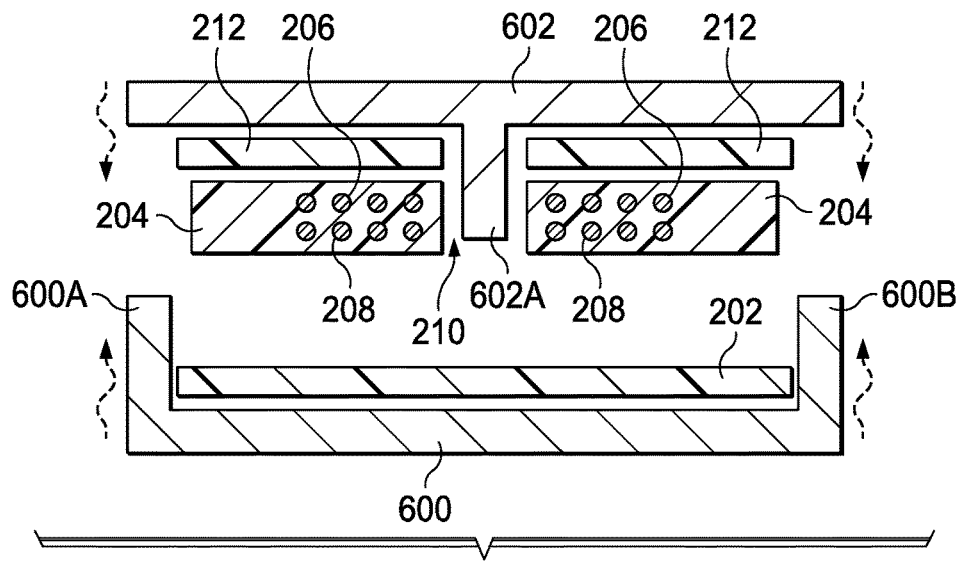
FIGS. 6A and 6B depict frontal, cross-sectional views of the manufacture of a semiconductor package housing a transformer comprising a build-up film and alternative magnetic members, in accordance with various examples.
Figure 6B:
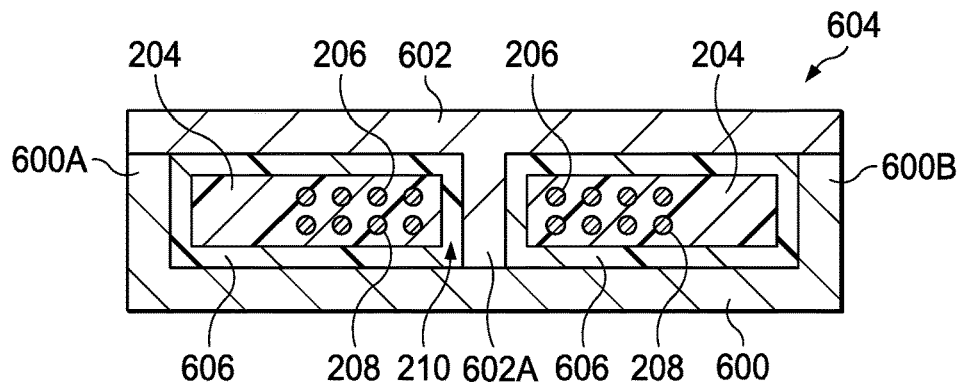

In yet another example, FIG. 6A depicts an assembly in which a first magnetic member 600 is a U core member and a second magnetic member 602 is a T core member. The application of heat and pressure, as the arrows in FIG. 6A depict, results in the formation of a transformer device 604 (FIG. 6B) in which the first and second magnetic members 600, 602 are in contact with each other and in which the build-up films 202, 212 are melted into a build-up film 606 (which may be said to include build-up films 202, 212). In examples, the build-up film 606 fills all areas between the laminate member 204 and the first and second magnetic members 600, 602, including the orifice 210. The first magnetic member 600 comprises extensions 600A, 600B positioned laterally to the laminate member 204, and the second magnetic member 602 comprises an extension 602A that is positioned within the orifice 210.

Figure 7A:
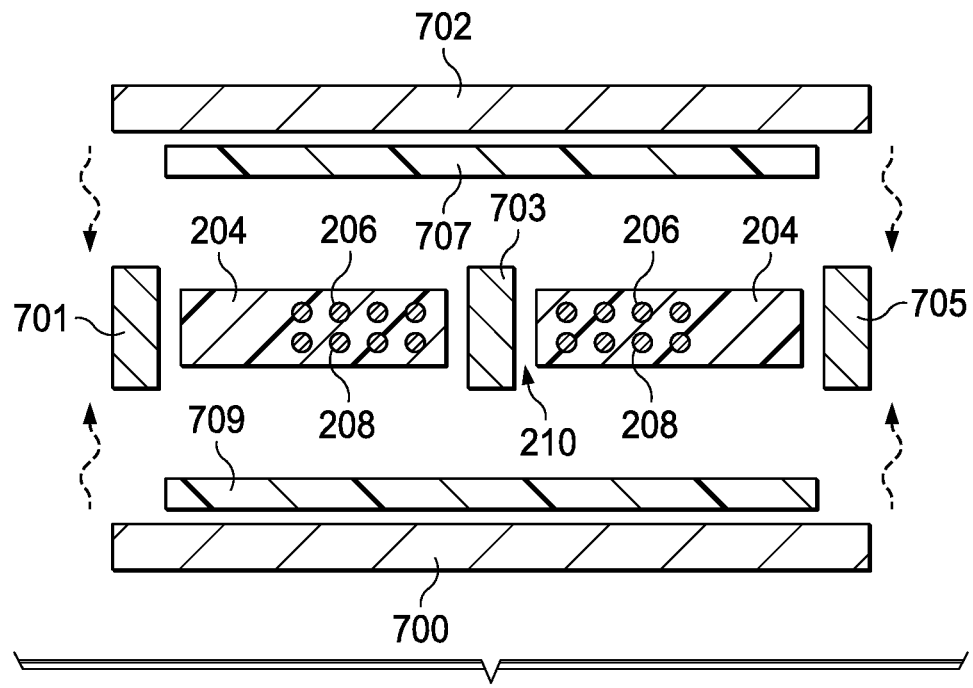
FIGS. 7A and 7B depict frontal, cross-sectional views of the manufacture of a semiconductor package housing a transformer comprising a build-up film and alternative magnetic members, in accordance with various examples.
Figure 7B:
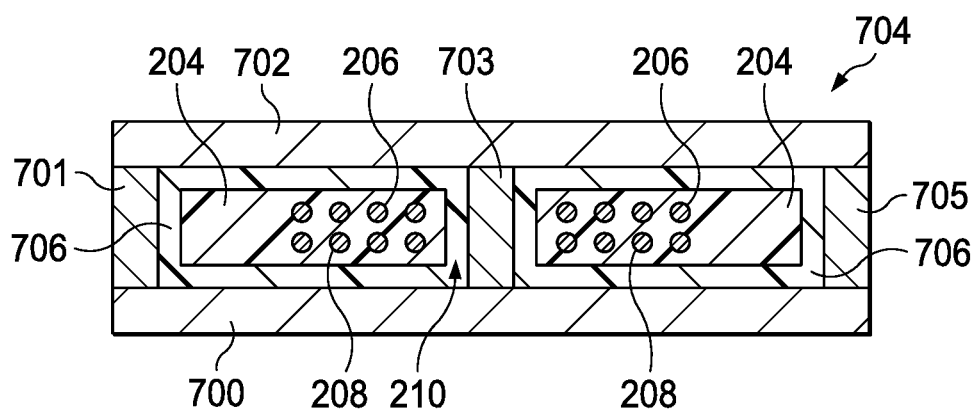

In still another example, FIG. 7A depicts an assembly in which a first magnetic member 700 is an I core member and a second magnetic member 702 is also an I core member. Additional magnetic members 701, 703, and 705 (which may be referred to herein as "pillars") are included and are composed of high-permeability ferrite material with properties similar to those of the first and second magnetic members, described above. The magnetic members 701 and 705 are positioned laterally to the laminate member 204, and the magnetic member 703 is positioned in the orifice 210. Build-up film 707 is positioned between the laminate member 204 and the second magnetic member 702, and the build-up film 709 is positioned between the laminate member 204 and the first magnetic member 700. The application of heat and pressure, as the arrows in FIG. 7A depict, results in the formation of a transformer device 704 (FIG. 7B) in which each of the first and second magnetic members 700, 702 is in contact with the magnetic members 701, 703, and 705 and in which the build-up films 707, 709 are melted to form a build-up film 706 (which may be said to include build-up films 707, 709). In examples, the build-up film 706 fills all areas between the laminate member 204 and the magnetic members 700, 702, 701, and 705, including the orifice 210.

In the examples described above, the application of heat and pressure causes the build-up films to melt and flow. The flow of the melted build-up film may be controlled (e.g., prevented from flowing to undesired areas) by applying heat and pressure in light of the viscosity and other appropriate properties of the build-up films.

The terms "first" and "second" are used herein to refer to various components, such as magnetic members and build-up films. These designations (e.g., "first," "second," etc.) are made for convenience of description and do not necessarily denote any particular functional or structural significance to the components to which they are ascribed.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications. Unless otherwise stated, "about," "approximately," "similar to," or "substantially" preceding a value means +/−10 percent of the stated value.

What is claimed is:

1. A semiconductor device, comprising:
a first magnetic member;
a second magnetic member, wherein the second magnetic member comprises a T core member and the first magnetic member comprises a U core member;
a laminate member positioned between the first and second magnetic members, the laminate member containing primary and secondary transformer windings; and
a build-up film material positioned between the first and second magnetic members and abutting the laminate member.

2. The semiconductor device of claim 1, wherein the first magnetic member comprises a high permeability ferrite member.

3. The semiconductor device of claim 1, wherein a first magnetic pillar of the multiple magnetic pillars is positioned inside an orifice of the laminate member.

4. A semiconductor device, comprising:
a first magnetic member;
a second magnetic member, wherein the second magnetic member comprises a U core member and the first magnetic member comprises a T core member,
a laminate member positioned between the first and second magnetic members, the laminate member containing primary and secondary transformer windings; and
a build-up film material positioned between the first and second magnetic members and abutting the laminate member.

5. The semiconductor device of claim 4, wherein a first magnetic pillar of the multiple magnetic pillars is positioned inside an orifice of the laminate member.

6. The semiconductor device of claim 4, wherein a portion of one of the first and second magnetic members is positioned inside an orifice of the laminate member.

7. A semiconductor device, comprising:
a first magnetic member;
a second magnetic member, wherein the first and second magnetic members comprise I core members, and wherein the device further includes multiple magnetic pillars;
a laminate member positioned between the first and second magnetic members,
the laminate member containing primary and secondary transformer windings; and
a build-up film material positioned between the first and second magnetic members and abutting the laminate member.

8. The semiconductor device of claim 7, wherein a first magnetic pillar of the multiple magnetic pillars is positioned inside an orifice of the laminate member.

9. The semiconductor device of claim 7, wherein a portion of one of the first and second magnetic members is positioned inside an orifice of the laminate member.

10. The semiconductor device of claim 7, wherein the first magnetic member comprises a high permeability ferrite member.

11. The semiconductor device of claim 7, wherein a portion of one of the first and second magnetic members is positioned inside an orifice of the laminate member.

12. A semiconductor package, comprising:
a first magnetic member;
a second magnetic member, wherein the second magnetic member comprises a T core member and the first magnetic member comprises a U core member;
a laminate member positioned between the first and second magnetic members, the laminate member containing primary and secondary transformer windings;
a build-up film material positioned between the first and second magnetic members and abutting the laminate member; and
mold material covering the first magnetic member, the second magnetic member, the laminate member, and the build-up film.

13. The semiconductor package of claim 12, wherein a portion of one of the first and second magnetic members is positioned inside an orifice of the laminate member.

14. The semiconductor package of claim 12, wherein a first magnetic pillar of the multiple magnetic pillars is positioned inside an orifice of the laminate member.

15. A semiconductor package, comprising:
a first magnetic member;
a second magnetic member, wherein the second magnetic member comprises a U core member and the first magnetic member comprises a T core member;
a laminate member positioned between the first and second magnetic members, the laminate member containing primary and secondary transformer windings;
a build-up film material positioned between the first and second magnetic members and abutting the laminate member; and
mold material covering the first magnetic member, the second magnetic member, the laminate member, and the build-up film.

16. The semiconductor package of claim 15, wherein a first magnetic pillar of the multiple magnetic pillars is positioned inside an orifice of the laminate member.

17. The semiconductor package of claim 15, wherein a portion of one of the first and second magnetic members is positioned inside an orifice of the laminate member.

18. A semiconductor package, comprising:
a first magnetic member;
a second magnetic member, wherein the first and second magnetic members comprise I core members, and wherein the device further includes multiple magnetic pillars;
a laminate member positioned between the first and second magnetic members, the laminate member containing primary and secondary transformer windings;
a build-up film material positioned between the first and second magnetic members and abutting the laminate member; and
mold material covering the first magnetic member, the second magnetic member, the laminate member, and the build-up film.

19. The semiconductor package of claim 18, wherein a first magnetic pillar of the multiple magnetic pillars is positioned inside an orifice of the laminate member.

20. The semiconductor package of claim 18, wherein a portion of one of the first and second magnetic members is positioned inside an orifice of the laminate member.

21. A semiconductor device, comprising:
a laminate member positioned between first and second magnetic members, the laminate member containing primary and secondary transformer windings; and
a build-up film material positioned between the first and second magnetic members and abutting the laminate member, wherein the second magnetic member comprises a T core member and the first magnetic member comprises a U core member.

22. The semiconductor device of claim 21, further including mold material covering the first magnetic member, the second magnetic member, the laminate member, and the build-up film.

23. The semiconductor device of claim 21, wherein a first magnetic pillar of the multiple magnetic pillars is positioned inside an orifice of the laminate member.

24. The semiconductor device of claim 21, wherein a portion of one of the first and second magnetic members is positioned inside an orifice of the laminate member.

25. A semiconductor device, comprising:
a laminate member positioned between first and second magnetic members, the laminate member containing primary and secondary transformer windings; and
a build-up film material positioned between the first and second magnetic members and abutting the laminate member, wherein the second magnetic member comprises a U core member and the first magnetic member comprises a T core member.

26. The semiconductor device of claim 25, wherein a first magnetic pillar of the multiple magnetic pillars is positioned inside an orifice of the laminate member.

27. The semiconductor device of claim 25, wherein a portion of one of the first and second magnetic members is positioned inside an orifice of the laminate member.

28. The semiconductor device of claim 25, further including mold material covering the first magnetic member, the second magnetic member, the laminate member, and the build-up film.

29. A semiconductor device, comprising:
a laminate member positioned between first and second magnetic members, the laminate member containing primary and secondary transformer windings; and
a build-up film material positioned between the first and second magnetic members and abutting the laminate member, wherein the first and second magnetic members comprise I core members, and wherein the device further includes multiple magnetic pillars.

30. The semiconductor device of claim 29, wherein a first magnetic pillar of the multiple magnetic pillars is positioned inside an orifice of the laminate member.

31. The semiconductor device of claim 29, wherein a portion of one of the first and second magnetic members is positioned inside an orifice of the laminate member.

32. The semiconductor device of claim 29, further including mold material covering the first magnetic member, the second magnetic member, the laminate member, and the build-up film.

* * * * *